(12) United States Patent
Cao et al.

(10) Patent No.: US 12,207,514 B2
(45) Date of Patent: Jan. 21, 2025

(54) FLEXIBLE DISPLAY PANEL (71) Applicant: SHENZHEN CHINA STAR OPTOELECTRONICS SEMICONDUCTOR DISPLAY TECHNOLOGY CO., LTD., Guangdong (CN)

(72) Inventors: Weiran Cao, Guangdong (CN); Weijing Zeng, Guangdong (CN); Baixiang Han, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 547 days.

(21) Appl. No.: 17/623,373

(22) PCT Filed: Dec. 21, 2021

(86) PCT No.: PCT/CN2021/140218
§ 371 (c)(1),
(2) Date: Dec. 28, 2021

(87) PCT Pub. No.: WO2023/103086
PCT Pub. Date: Jun. 15, 2023

(65) Prior Publication Data
US 2023/0189597 A1 Jun. 15, 2023

(51) Int. Cl.
*H10K 59/131* (2023.01)
*H10K 102/00* (2023.01)

(52) U.S. Cl.
CPC ... *H10K 59/1315* (2023.02); *H10K 2102/311* (2023.02)

(58) Field of Classification Search
CPC ............. H10K 59/1315; H10K 2102/311
(Continued)

(56) References Cited

U.S. PATENT DOCUMENTS

2014/0217397 A1* 8/2014 Kwak ............. H01L 27/1218
257/43
2016/0103534 A1 4/2016 Zhang et al.
(Continued)

FOREIGN PATENT DOCUMENTS

CN 1645987 A 7/2005
CN 105144418 A 12/2015
(Continued)

OTHER PUBLICATIONS

Chinese Office Action issued in corresponding Chinese Patent Application No. 202111497994.9 dated Apr. 7, 2023, pp. 1-7.
(Continued)

*Primary Examiner* — Xia L Cross
(74) *Attorney, Agent, or Firm* — PV IP PC; Wei Te Chung (57) ABSTRACT

The present application provides a flexible display panel including: an underlay substrate; at least one first conductive line being continuous line-shaped, disposed on the underlay substrate; at least one second conductive line being broken line-shaped, corresponding to the first conductive line, and disposed on the first conductive line, wherein each of the second conductive line includes a plurality of conductive line sections, the conductive line sections are spaced from one another, and is electrically connected to a corresponding one of the first conductive line. A rigidity of the first conductive line is less than a rigidity of the conductive line sections, and a conductivity of the conductive line sections is greater than a conductivity of the first conductive line. The configuration of the first conductive line and the second (Continued)

conductive line makes the flexible display panel have both rigidity and conductivity.

20 Claims, 5 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2016/0211210 A1* | 7/2016 | Seo ................... | H01L 21/76838 |
| 2016/0219696 A1 | 7/2016 | Choi et al. | |
| 2017/0358641 A1 | 12/2017 | Park et al. | |
| 2020/0006397 A1* | 1/2020 | Park ................... | H01L 27/1244 |
| 2021/0375953 A1* | 12/2021 | Zhao ................... | H01L 27/1244 |

FOREIGN PATENT DOCUMENTS

| | | |
|---|---|---|
| CN | 105636339 A | 6/2016 |
| CN | 205657057 U | 10/2016 |
| CN | 106206613 A | 12/2016 |
| CN | 106373923 A | 2/2017 |
| CN | 106816459 A | 6/2017 |
| CN | 108231854 A | 6/2018 |
| CN | 108389869 A | 8/2018 |
| CN | 108417604 A | 8/2018 |
| CN | 108922877 A | 11/2018 |
| CN | 109003960 A | 12/2018 |
| CN | 109309111 A | 2/2019 |
| CN | 110335875 A | 10/2019 |
| CN | 210167358 U | 3/2020 |
| CN | 211670195 U | 10/2020 |
| CN | 112863349 A | 5/2021 |
| CN | 113571259 A | 10/2021 |
| JP | 2000321589 A | 11/2000 |
| JP | 2002015917 A | 1/2002 |
| JP | 2017533583 A | 11/2017 |
| JP | 2018155999 A | 10/2018 |
| JP | 2021508852 A | 3/2021 |
| WO | 2014126403 A1 | 8/2014 |
| WO | 2019186702 A1 | 10/2019 |

OTHER PUBLICATIONS

International Search Report in International application No. PCT/CN2021/140218, mailed on Aug. 1, 2022.
Written Opinion of the International Search Authority in International application No. PCT/CN2021/140218, mailed on Aug. 1, 2022.
Chinese Office Action issued in corresponding Chinese Patent Application No. 202111497994.9 dated Nov. 11, 2022, pp. 1-7.
Japanese Office Action issued in corresponding Japanese Patent Application No. 特願2021-577703 dated Jan. 30, 2024, pp. 1-11.

* cited by examiner

FLEXIBLE DISPLAY PANEL

CROSS-REFERENCE TO RELATED APPLICATIONS

This application is a 371 U.S. National Phase of International Application No. PCT/CN2021/140218, filed Dec. 21, 2021, which claims priority to Chinese Patent Application No. 202111497994.9, filed Dec. 9, 2021. The entire disclosures of the above applications are incorporated herein by reference.

FIELD OF INVENTION

The present application relates to a field of display technologies, especially to a flexible display panel.

BACKGROUND OF INVENTION

Flexible display devices, as display products of a new generation, have attracted more and more attention due to their ultra-light, ultra-thin, high-resolution, fast response, bendable, and convenient portability. The flexible display device needs to be rolled up or curved, and even frequently bent. In narrow frame/frameless flexible technologies, many metal wirings are distributed in a bending region of a flexible display device. After a product is bent, the metal wirings in the bending region suffer a greater stress. Because the stress on the metal wirings cannot be released in time, the stress is easily concentrated to result in cracks on the metal wirings and even cause rupture, which results in increase of a resistance of the metal wirings or malfunction of the product and significantly affects a lifespan of a flexible display device.

SUMMARY OF INVENTION

Technical Issue

An embodiment of the present application provides a flexible display panel to solve the technical issue that when a conventional flexible display panel is bent, metal wirings suffer curving stress and is easily deformed, ruptured, or structurally changed to further result in a lowered signal carrying function of the metal wirings or malfunction.

Technical Solution

In an aspect, the embodiment of the present application provides a flexible display panel comprising:
an underlay substrate;
at least one first conductive line being continuous line-shaped, disposed on a bending region of the underlay substrate;
at least one second conductive line being broken line-shaped, corresponding to the first conductive line, and disposed on the first conductive line, wherein the second conductive line comprises a plurality of conductive line sections, the conductive line sections are spaced from one another, and are electrically connected to a corresponding one of the first conductive line; and
a passivation layer covering the first conductive line and the second conductive line;
wherein a rigidity of the first conductive line is less than a rigidity of the conductive line sections, and a conductivity of the conductive line sections is greater than a conductivity of the first conductive line.

In some embodiments of the present application, the flexible display panel further comprises an interlayer dielectric layer disposed on the underlay substrate and covering the first conductive line, a plurality of via holes are defined through the interlayer dielectric layer and correspond to the conductive line sections; and the second conductive line is disposed on the interlayer dielectric layer, and each of the conductive line sections is electrically connected to the first conductive line through a corresponding one of the via holes.

In some embodiments of the present application, each of the conductive line sections is electrically connected to a corresponding one of the first conductive line through two of the via holes.

In some embodiments of the present application, the second conductive line is directly disposed on the first conductive line, and the conductive line sections are directly disposed on a corresponding one of the first conductive line.

In some embodiments of the present application, a thickness of the conductive line section is greater than or equal to a thickness of the first conductive line.

In some embodiments of the present application, a width of the conductive line section is less than or equal to a width of the first conductive line.

In some embodiments of the present application, the first conductive line is linear or meandering; and the conductive line section is linear or meandering.

In some embodiments of the present application, a plurality of through holes are defined through the first conductive line.

In another aspect, the embodiment of the present application provides a flexible display panel comprising:
an underlay substrate;
at least one first conductive line being continuous line-shaped, disposed on a bending region of the underlay substrate;
an interlayer dielectric layer disposed on the underlay substrate and covering the first conductive line;
at least one second conductive line being broken line-shaped, corresponding to the first conductive line, and disposed on the first conductive line, wherein the second conductive line comprises a plurality of conductive line sections, the conductive line sections are spaced from one another, disposed on the interlayer dielectric layer, and are electrically connected to a corresponding one of the first conductive line; and
a passivation layer disposed on the interlayer dielectric layer and covering the first conductive line and the second conductive line;
wherein a rigidity of the first conductive line is less than a rigidity of the conductive line sections, and a conductivity of the conductive line sections is greater than a conductivity of the first conductive line;
wherein a thickness of the conductive line section is greater than or equal to a thickness of the first conductive line;
wherein a width of the conductive line section is less than or equal to a width of the first conductive line.

In some embodiments of the present application, a material of the first conductive line is selected from indium gallium zinc oxide, indium tin oxide, silver contained conductive glue and a mixture thereof; and a material of the second conductive line is selected from copper, silver, aluminum, and a mixture thereof.

In some embodiments of the present application, a perpendicular cross-section of the conductive line section of the second conductive line is rectangular or trapezoidal.

In some embodiments of the present application, a perpendicular cross-section of the via hole is rectangular or inverted trapezoidal.

In another aspect, the embodiment of the present application provides a flexible display panel comprising:
- an underlay substrate;
- at least one first conductive line being continuous line-shaped, disposed on a bending region of the underlay substrate;
- at least one second conductive line being broken line-shaped, corresponding to the first conductive line, and disposed on the first conductive line, wherein the second conductive line comprises a plurality of conductive line sections, the conductive line sections are spaced from one another, and are electrically connected to a corresponding one of the first conductive line; and
- a passivation layer covering the first conductive line and the second conductive line;
- wherein a rigidity of the first conductive line is less than a rigidity of the conductive line sections, and a conductivity of the conductive line sections is greater than a conductivity of the first conductive line;
- wherein a thickness of the conductive line section is greater than or equal to a thickness of the first conductive line;
- wherein a width of the conductive line section is less than or equal to a width of the first conductive line.

In some embodiments of the present application, the flexible display panel further comprises an interlayer dielectric layer disposed on the underlay substrate and covering the first conductive line, a plurality of via holes are defined through the interlayer dielectric layer and correspond to the conductive line sections; and
the second conductive line is disposed on the interlayer dielectric layer, and each of the conductive line sections is electrically connected to the first conductive line through a corresponding one of the via holes.

In some embodiments of the present application, each of the conductive line sections is electrically connected to a corresponding one of the first conductive line through two of the via holes.

In some embodiments of the present application, the second conductive line is directly disposed on the first conductive line, and the conductive line sections are directly disposed on a corresponding one of the first conductive line.

In some embodiments of the present application, the first conductive line is linear or meandering; and
the conductive line section is linear or meandering.

In some embodiments of the present application, a plurality of through holes are defined through the first conductive line.

In some embodiments of the present application, a perpendicular cross-section of the conductive line section of the second conductive line is rectangular or trapezoidal.

In some embodiments of the present application, a perpendicular cross-section of the via hole is rectangular or inverted trapezoidal.

In another aspect, the embodiment of the present application provides a flexible display panel comprising:
- an underlay substrate;
- at least one first conductive line being continuous line-shaped, disposed on a bending region of the underlay substrate;
- at least one second conductive line being broken line-shaped, corresponding to the first conductive line, and disposed on the first conductive line, wherein the second conductive line comprises a plurality of conductive line sections, the conductive line sections are spaced from one another, and are electrically connected to a corresponding one of the first conductive line; and
- a passivation layer covering the first conductive line and the second conductive line;
- wherein a rigidity of the first conductive line is less than a rigidity of the conductive line sections, and a conductivity of the conductive line sections is greater than a conductivity of the first conductive line;
- wherein a plurality of through holes are defined through the first conductive line.
- wherein a width of the conductive line section is less than or equal to a width of the first conductive line.

In some embodiments of the present application, a perpendicular cross-section of the conductive line section of the second conductive line is rectangular or trapezoidal.

Advantages

The present application comprises at least advantages as follows:

The flexible display panel of the embodiment of the present application disposes electrically connected first conductive line and second conductive line. The first conductive line is continuous line-shaped and has a smaller rigidity (Stiffness, an antonym thereof is flexibility. In the specification, rigidity refers to a degree of bending resistance under a condition of the conductive line bent without causing permanently unrecoverable deformation. Usually, rigidity is indicated by: $P/\delta$, wherein P refers to a force, $\delta$ refers to deformation amount). The second conductive line is broken line-shaped and comprises a plurality of conductive line sections spaced from one another. A rigidity of the first conductive line is less than a rigidity of the conductive line sections, and a conductivity of the conductive line sections is greater than a conductivity of the first conductive line such that the flexible display panel simultaneously comprises low rigidity and high conductivity, can prevent conductive lines from rupture and damage by high flexibility of the first conductive line when high flexibility when bending, and can maintain excellent electrical signal transmission on the flexible display panel by high conductivity of the second conductive line. Therefore, the present application solves the technical issue that when a conventional flexible display panel is bent, metal wirings suffer curving stress and is easily deformed, ruptured, or structurally changed to further result in a lowered signal carrying function of the metal wirings or malfunction. The present application mitigates the issue that the stress on the metal wirings cannot be released in time, the stress is easily concentrated to result in cracks on the metal wirings and even cause rupture, and achieve a goal of preventing increase of a resistance of the metal wirings or malfunction of the product and improving a lifespan of a flexible display device.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application.

The embodiment of the present application provides a flexible display panel 1, which will be described in detail respectively. It should be explained that the following description order of embodiments has no limit to a preferred order of the embodiments.

The embodiment of the present application provides a flexible display panel 1 to solve the technical issue that when a conventional flexible display panel is bent, metal wirings suffer curving stress and is easily deformed, ruptured, or structurally changed to further result in a lowered signal carrying function of the metal wirings or malfunction. The flexible display panel 1 of the embodiment of the present application can serve as a circuit board structure of a bending region between two assemblies in a general electronic device, alternatively, the flexible display panel 1 can serve as a foldable substrate in a bending region of the flexible display panel to allow light emitting elements such as organic light emitting diodes and pixel circuits to be disposed on the flexible display panel.

With reference to FIGS. 1 to 5, the embodiment of the present application provides a flexible display panel 1 comprising: an underlay substrate 10, at least one first conductive line 20, at least one second conductive line 40, and a passivation layer 50.

A material of the underlay substrate 10 can be polyimide (PI).

The at least one first conductive line 20 is formed by patterning a first metal layer M1 disposed on the underlay substrate, is continuous line-shaped, and is disposed on a bending region of the underlay substrate 10. Furthermore, a thickness of the first conductive line 20 can be equal to or less than 200 nm. When a material of the first conductive line 20 is indium gallium zinc oxide (IGZO), the thickness thereof can be further reduced to be equal to or less than 30 nm to lower a rigidity (Stiffness, an antonym thereof is flexibility. In the specification, rigidity refers to a degree of bending resistance under a condition of the conductive line bent without causing permanently unrecoverable deformation. Usually, rigidity is indicated by: P/δ, wherein P refers to a force, δ refers to deformation amount) of the first conductive line 20 to improve its bending ability. When the material of the first conductive line 20 is indium tin oxide (ITO), its thickness can be further reduced be equal to or less than 20 nm to lower the rigidity of the first conductive line 20 to improve its bending ability.

The at least one second conductive line 40 is formed by patterning a second metal layer M2 located on the first metal layer M1, is broken line-shaped, corresponds to the first conductive line 20, and is disposed on the first conductive line 20. Each of the second conductive line 40 comprises a plurality of conductive line sections 41, the conductive line sections 41 are spaced from one another, and are electrically connected to a corresponding one of the first conductive line 20.

The passivation layer 50 covers the first conductive line 20 and the second conductive line 40.

A rigidity of the first conductive line 20 is less than a rigidity of the conductive line sections 41, and a conductivity of the conductive line sections 41 is greater than a conductivity of the first conductive line 20.

Figure 1:
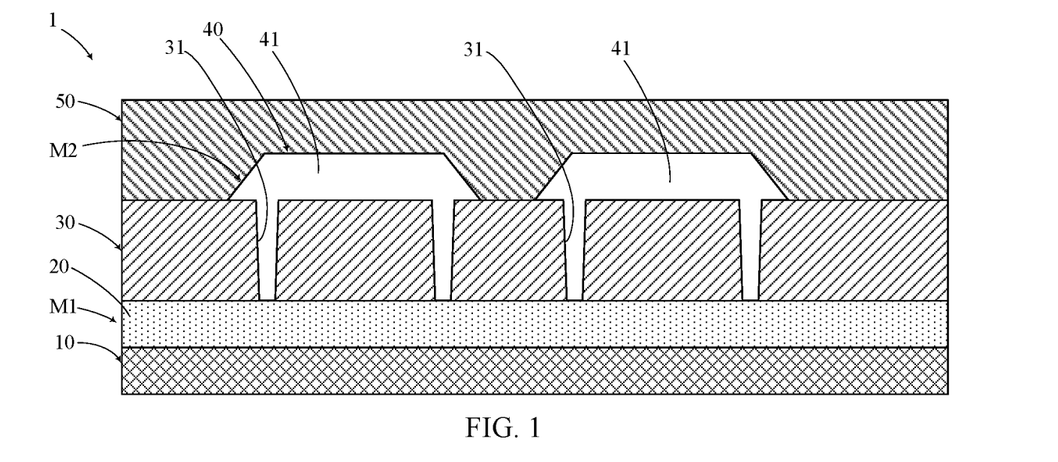
FIG. 1 is a cross-sectional side view of a flexible display panel provided by a first embodiment of the present application.
Figure 2:
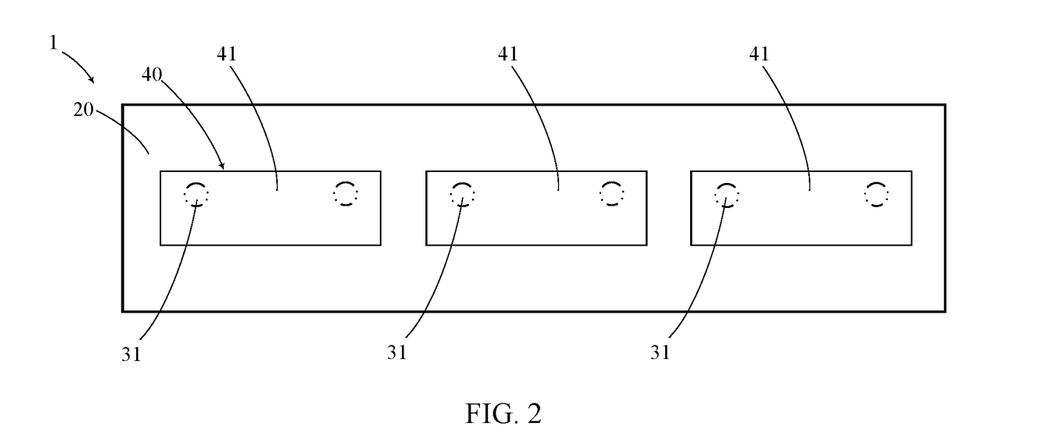
FIG. 2 is a top view of the flexible display panel provided by the first embodiment of the present application, wherein an interlayer dielectric layer and a passivation layer are omitted.

With reference to FIGS. 1 and 2, in a first embodiment of the present application, the flexible display panel 1 further comprises an interlayer dielectric layer 30 disposed on the underlay substrate 10 and covering the first conductive line 20, a plurality of via holes 31 are defined through the interlayer dielectric layer 30 and corresponding to the conductive line sections 41. The second conductive line 40 is disposed on the interlayer dielectric layer 30. Each of the conductive line sections 41 is disposed on the interlayer dielectric layer 30, and is electrically connected to a corresponding one of the first conductive line 20 through a corresponding one of the via holes 31. Furthermore, a material of the interlayer dielectric layer 30 can be a organic material or an inorganic material.

In the first embodiment of the present application, each of the conductive line sections 411 is electrically connected to a corresponding one of the first conductive line 20 through two of the via holes 3.

In some embodiments of the present application, the first conductive line 20 is linear or meandering; and the conductive line sections 41 is linear or meandering.

Figure 3:
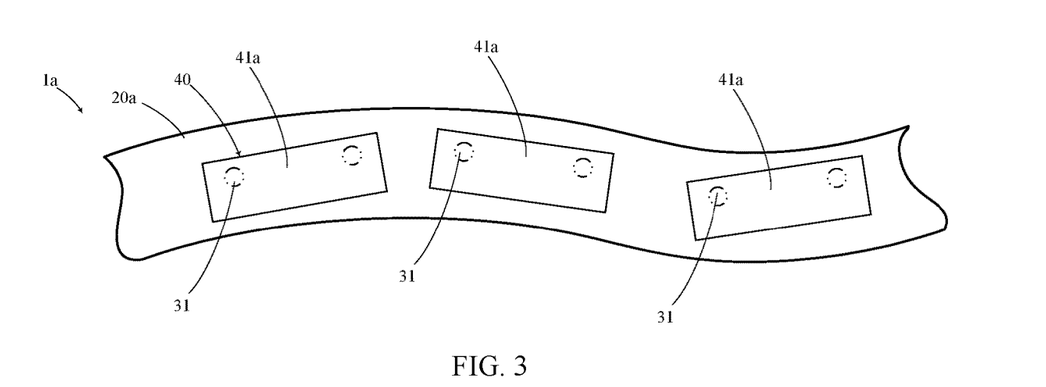
FIG. 3 is a top view of a flexible display panel provided by a second embodiment of the present application, wherein the interlayer dielectric layer and the passivation layer are omitted.

With reference to FIG. 3, in a second embodiment of the present application, the first conductive line 20a of the flexible display panel 1a is meandering, the conductive line sections 41a is linear.

Figure 4:
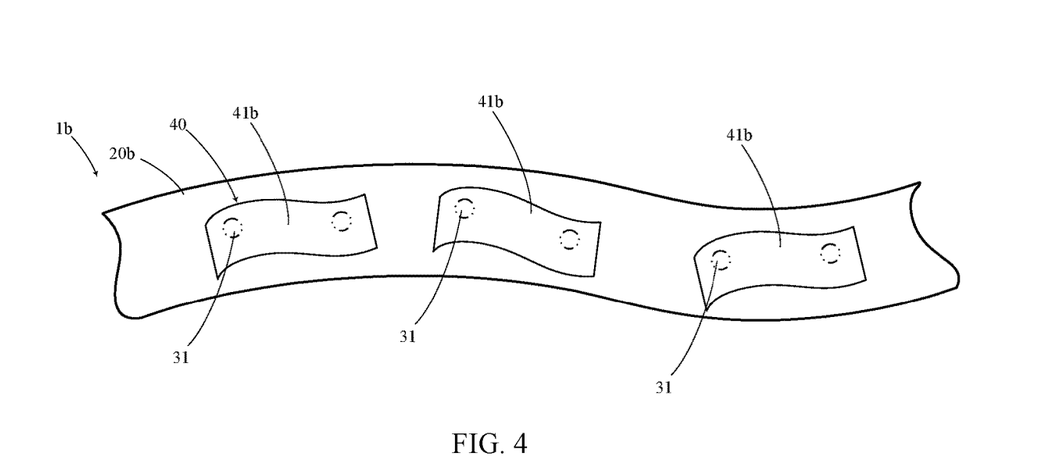
FIG. 4 is a top view of the flexible display panel provided by a third embodiment of the present application, wherein the interlayer dielectric layer and the passivation layer.

With reference to FIG. 4, in the second embodiment of the present application, the first conductive line 20b of the flexible display panel 1b is meandering; and the conductive line sections 41b is meandering.

Figure 5:
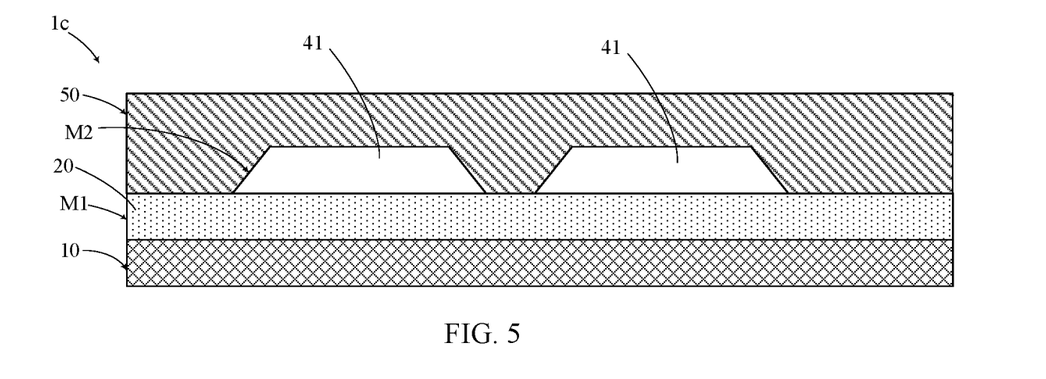
FIG. 5 is a cross-sectional side view of the flexible display panel provided by a fourth embodiment of the present application.

With reference to FIG. 5, in a fourth embodiment of the present application, the second conductive line 40 of the flexible display panel 1c is directly disposed on the first conductive line 20, and the conductive line sections 41 are directly disposed on a corresponding one of the first conductive line 20.

In some embodiments of the present application, a thickness of the conductive line sections 41 is greater than or equal to a thickness of the first conductive line 20. Increasing the thickness of the second conductive line can further improve the conductivity of the second conductive line.

In some embodiments of the present application, a width of the conductive line sections 41 is less than or equal to a width of the first conductive line 20. Reducing the thickness of the first conductive line can further lower the rigidity of the flexible display panel 1 to improve its bending ability.

Figure 6:
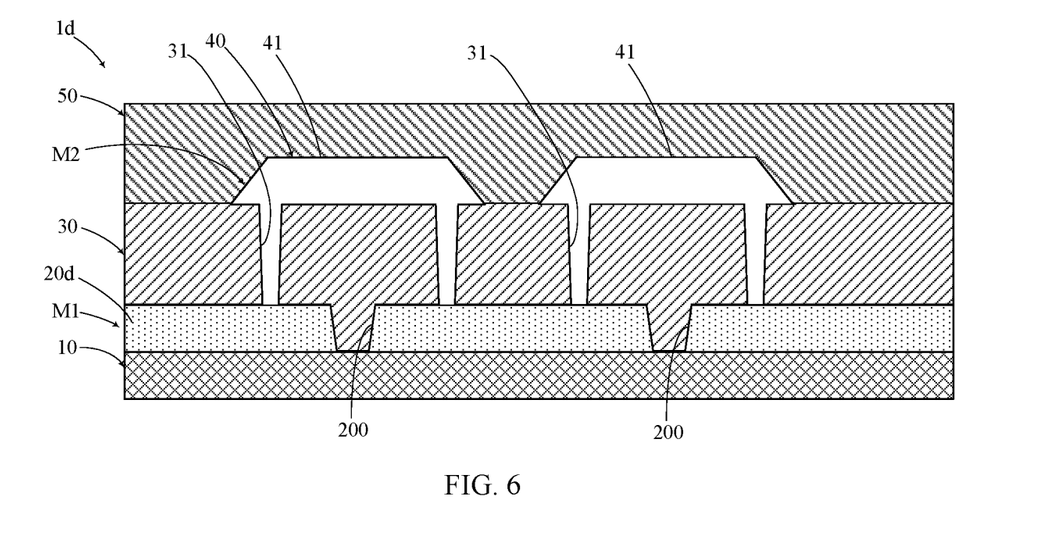
FIG. 6 is a cross-sectional side view of the flexible display panel of provided by a fifth embodiment of the present application.
Figure 7:
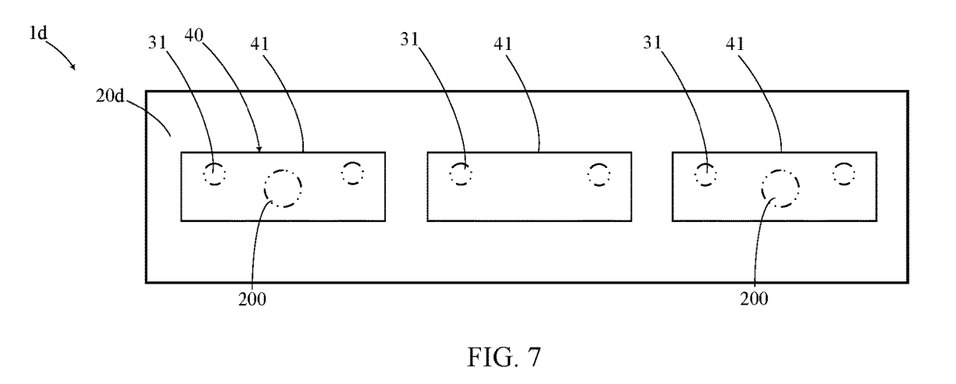
FIG. 7 is a top view of the flexible display panel provided by a fifth embodiment of the present application, wherein the interlayer dielectric layer and the passivation layer.

With reference to FIGS. 6 and 7, the flexible display panel 1d of a fifth embodiment of the present application is similar to the flexible display panel 1 of the first embodiment, and a difference of the fifth embodiment is that a plurality of through holes 200 are defined through the first conductive line 20. The configuration of the through holes 200 can further make the first conductive line 20 softer and lower its rigidity to improve its bending ability.

Figure 8:
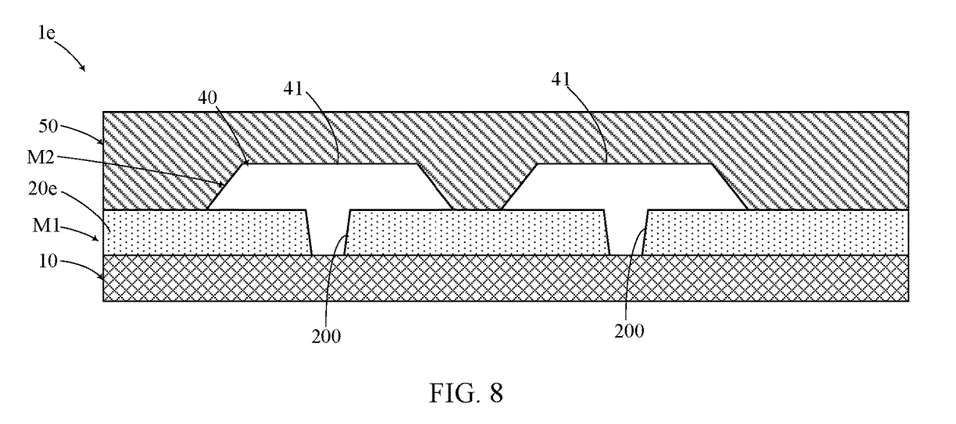
FIG. 8 is a cross-sectional side view of the flexible display panel provided by a sixth embodiment of the present application.
Figure 9:
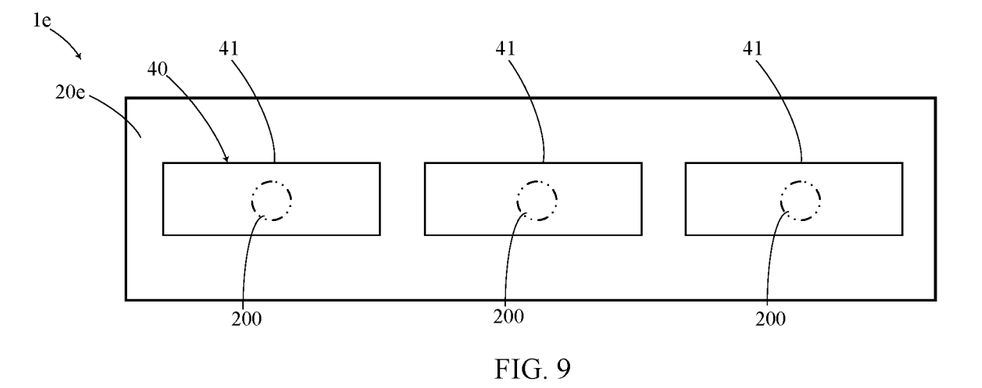
FIG. 9 is a top view of the flexible display panel provided by the sixth embodiment of the present application, wherein the passivation layer is omitted.

With reference to FIGS. 8 and 9, the flexible display panel 1e of a sixth embodiment of the present application is similar to the flexible display panel 1 of the fourth embodiment, and a difference of the sixth embodiment is that a plurality of through holes 200 are defined through the first conductive line 20. The configuration of the through holes 200 can further make the first conductive line 20 softer to lower its rigidity to improve its bending ability.

In another aspect, with further reference to FIGS. 1 and 4, the embodiment of the present application provides a flexible display panel 1 comprising: an underlay substrate 10, at least one first conductive line 20, an interlayer dielectric layer 30, at least one second conductive line 40, and a passivation layer 50.

A material of the underlay substrate 10 can be polyimide (PI).

The at least one first conductive line 20 is formed by patterning a first metal layer M1 disposed on the underlay substrate, is continuous line-shaped, and disposed on a bending region of the underlay substrate 10. Furthermore, a thickness of the first conductive line 20 can be equal to or less than 200 nm. When a material of the first conductive line 20 is indium gallium zinc oxide (IGZO), its thickness can be further reduced to be equal to or less than 30 nm to lower the rigidity of the first conductive line 20 to improve its bending ability. When the material of the first conductive line 20 material is indium tin oxide (ITO), the thickness thereof can be further reduced to be equal to or less than 20 nm to lower the rigidity of the first conductive line 20 to improve its bending ability.

The interlayer dielectric layer 30 is disposed on the underlay substrate 10 and covers the at least one first conductive line 20. Furthermore, a material of the interlayer dielectric layer 30 can be organic material or inorganic material.

The at least one second conductive line 40 is formed by patterning a second metal layer M2 disposed on the interlayer dielectric layer 30, is broken line-shaped, corresponds to the first conductive line 20, is disposed on the first conductive line 20, wherein each of the second conductive line 40 comprises a plurality of conductive line sections 41.

The conductive line sections 41 are spaced from one another, are disposed on the interlayer dielectric layer 30, and are electrically connected to a corresponding one of the first conductive line 20.

The passivation layer 50 is disposed on the interlayer dielectric layer 30 and covers the first conductive line 20 and the second conductive line 40;

A rigidity of the first conductive line 20 is less than a rigidity of the conductive line sections 41, a conductivity of the conductive line sections 41 is greater than a conductivity of the first conductive line 20.

A thickness of the conductive line sections 41 is greater than or equal to a thickness of the first conductive line 20. A width of the conductive line sections 41 is less than or equal to a width of the first conductive line 20. Increasing the thickness of the second conductive line can further improve the conductivity of the second conductive line. Reducing the thickness of the first conductive line can further decrease the rigidity of the flexible display panel 1 to improve its bending ability.

In some embodiments of the present application, a material of the first conductive line 20 is selected from indium gallium zinc oxide (IGZO), indium tin oxide (ITO), silver contained conductive glue, and a mixture thereof. A material of the second conductive line 40 is selected from copper, silver, aluminum, and a mixture thereof.

In some embodiments of the present application, according requirements of layout, a perpendicular cross-section of the conductive line sections 41 of the second conductive line 40 is rectangular or trapezoidal to improve bending ability and lifespan of the flexible display panel 1.

In some embodiments of the present application, according requirements of layout, a perpendicular cross-section of the via hole 31 is rectangular or inverted trapezoidal to improve bending ability and lifespan of the flexible display panel 1.

The present application comprises at least advantages as follows:

The flexible display panel 1, 1a, 1b, 1c, 1d, 1e of the embodiment of the present application disposes electrically connected first conductive line 20 and second conductive line. The first conductive line 20 is continuous line-shaped and has a smaller rigidity. The second conductive line 40 is broken line-shaped and comprises a plurality of conductive line sections 41 spaced from one another. A rigidity of the first conductive line 20 is less than a rigidity of the conductive line sections 41, and a conductivity of the conductive line sections 41 is greater than a conductivity of the first conductive line 20 such that the flexible display panel 1, 1a, 1b, 1c, 1d, 1e simultaneously comprises low rigidity and high conductivity, can prevent conductive lines from rupture and damage by high flexibility of the first conductive line 20 when high flexibility when bending, and can maintain excellent electrical signal transmission on the flexible display panel 1, 1a, 1b, 1c, 1d, 1e by high conductivity of the second conductive line. Therefore, the present application solves the technical issue that when a conventional flexible display panel 1, 1a, 1b, 1c, 1d, 1e is bent, metal wirings suffer curving stress and is easily deformed, ruptured, or structurally changed to further result in a lowered signal carrying function of the metal wirings or malfunction. The present application mitigates the issue that the stress on the metal wirings cannot be released in time, the stress is easily concentrated to result in cracks on the metal wirings and even cause rupture, and achieve a goal of preventing increase of a resistance of the metal wirings or malfunction of the product and improving a lifespan of a flexible display device.

The flexible display panel 1, 1a, 1b, 1c, 1d, 1e provided by the embodiments of the present application is described as above. In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:

1. A flexible display panel, comprising:
an underlay substrate;
at least one first conductive line being continuous line-shaped, disposed on a bending region of the underlay substrate;
at least one second conductive line being broken line-shaped, corresponding to the first conductive line, and disposed on the first conductive line, wherein the second conductive line comprises a plurality of conductive line sections, the conductive line sections are spaced from one another, and are electrically connected to a corresponding one of the first conductive line; and
a passivation layer covering the first conductive line and the second conductive line;
wherein a rigidity of the first conductive line is less than a rigidity of the conductive line sections, and a conductivity of the conductive line sections is greater than a conductivity of the first conductive line.

2. The flexible display panel according to claim 1, wherein the flexible display panel further comprises an interlayer dielectric layer disposed on the underlay substrate and covering the first conductive line, a plurality of via holes are defined through the interlayer dielectric layer and correspond to the conductive line sections; and
the second conductive line is disposed on the interlayer dielectric layer, and each of the conductive line sections is electrically connected to the first conductive line through a corresponding one of the via holes.

3. The flexible display panel according to claim 2, wherein each of the conductive line sections is electrically connected to a corresponding one of the first conductive line through two of the via holes.

4. The flexible display panel according to claim 2, wherein a perpendicular cross-section of the via hole is rectangular or inverted trapezoidal.

5. The flexible display panel according to claim 1, wherein the second conductive line is directly disposed on the first conductive line, and the conductive line sections are directly disposed on a corresponding one of the first conductive line.

6. The flexible display panel according to claim 1, wherein a thickness of the conductive line section is greater than or equal to a thickness of the first conductive line.

7. The flexible display panel according to claim 1, wherein a width of the conductive line section is less than or equal to a width of the first conductive line.

8. The flexible display panel according to claim 1, wherein the first conductive line is linear or meandering; and the conductive line section is linear or meandering.

9. The flexible display panel according to claim 1, wherein a plurality of through holes are defined through the first conductive line.

10. The flexible display panel according to claim 1, wherein a perpendicular cross-section of the conductive line section of the second conductive line is rectangular or trapezoidal.

11. A flexible display panel, comprising:
an underlay substrate;
at least one first conductive line being continuous line-shaped, disposed on a bending region of the underlay substrate;
at least one second conductive line being broken line-shaped, corresponding to the first conductive line, and disposed on the first conductive line, wherein the second conductive line comprises a plurality of conductive line sections, the conductive line sections are spaced from one another, and are electrically connected to a corresponding one of the first conductive line; and
a passivation layer covering the first conductive line and the second conductive line;
wherein a rigidity of the first conductive line is less than a rigidity of the conductive line sections, and a conductivity of the conductive line sections is greater than a conductivity of the first conductive line;
wherein a thickness of the conductive line section is greater than or equal to a thickness of the first conductive line;
wherein a width of the conductive line section is less than or equal to a width of the first conductive line.

12. The flexible display panel according to claim 11, wherein the flexible display panel further comprises an interlayer dielectric layer disposed on the underlay substrate and covering the first conductive line, a plurality of via holes are defined through the interlayer dielectric layer and correspond to the conductive line sections; and
the second conductive line is disposed on the interlayer dielectric layer, and each of the conductive line sections is electrically connected to the first conductive line through a corresponding one of the via holes.

13. The flexible display panel according to claim 12, wherein each of the conductive line sections is electrically connected to a corresponding one of the first conductive line through two of the via holes.

14. The flexible display panel according to claim 12, wherein a perpendicular cross-section of the via hole is rectangular or inverted trapezoidal.

15. The flexible display panel according to claim 11, wherein the second conductive line is directly disposed on the first conductive line, and the conductive line sections are directly disposed on a corresponding one of the first conductive line.

16. The flexible display panel according to claim 11, wherein the first conductive line is linear or meandering; and the conductive line section is linear or meandering.

17. The flexible display panel according to claim 11, wherein a plurality of through holes are defined through the first conductive line.

18. The flexible display panel according to claim 11, wherein a perpendicular cross-section of the conductive line section of the second conductive line is rectangular or trapezoidal.

19. A flexible display panel comprising:
an underlay substrate;
at least one first conductive line being continuous line-shaped, disposed on a bending region of the underlay substrate;
at least one second conductive line being broken line-shaped, corresponding to the first conductive line, and disposed on the first conductive line, wherein the second conductive line comprises a plurality of conductive line sections, the conductive line sections are spaced from one another, and are electrically connected to a corresponding one of the first conductive line; and a passivation layer covering the first conductive line and the second conductive line;

wherein a rigidity of the first conductive line is less than a rigidity of the conductive line sections, and a conductivity of the conductive line sections is greater than a conductivity of the first conductive line;

wherein a plurality of through holes are defined through the first conductive line;

wherein a width of the conductive line section is less than or equal to a width of the first conductive line.

20. The flexible display panel according to claim 19, wherein a perpendicular cross-section of the conductive line section of the second conductive line is rectangular or trapezoidal.

\* \* \* \* \*